(12) United States Patent
Kikuchi et al.

(10) Patent No.: US 8,558,307 B2
(45) Date of Patent: Oct. 15, 2013

(54) SEMICONDUCTOR DEVICE WITH DIFFUSED MOS TRANSISTOR AND MANUFACTURING METHOD OF THE SAME

(75) Inventors: Shuichi Kikuchi, Ora-Gun (JP); Kiyofumi Nakaya, Konosu (JP); Shuji Tanaka, Ora-Gun (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 744 days.

(21) Appl. No.: 11/958,531

(22) Filed: Dec. 18, 2007

(65) Prior Publication Data

US 2009/0152628 A1 Jun. 18, 2009

(51) Int. Cl.
*H01L 29/66* (2006.01)

(52) U.S. Cl.
USPC ........... 257/335; 257/328; 257/336; 257/408; 257/E29.066; 257/E29.256

(58) Field of Classification Search
CPC ..................... H01L 29/7801; H01L 29/66681; H01L 29/7835; H01L 29/1045; H01L 29/66674
USPC .......... 257/335, 328, E29.066, E29.256, 336, 257/408
See application file for complete search history.

(56) References Cited

U.S. PATENT DOCUMENTS

| | | | |
|---|---|---|---|
| 5,347,155 A | 9/1994 | Ludikhuize | |
| 5,510,643 A * | 4/1996 | Kariyama | 257/409 |
| 5,981,997 A * | 11/1999 | Kitamura | 257/335 |
| 6,313,508 B1 | 11/2001 | Kobayashi | |
| 6,395,593 B1 | 5/2002 | Pendharkar et al. | |
| 2002/0146858 A1* | 10/2002 | Takahara | 438/100 |
| 2003/0173609 A1* | 9/2003 | Kaneko et al. | 257/299 |
| 2004/0256692 A1* | 12/2004 | Kunz et al. | 257/500 |
| 2006/0113592 A1* | 6/2006 | Pendharkar et al. | 257/335 |
| 2006/0145250 A1* | 7/2006 | Ma | 257/336 |
| 2006/0145285 A1 | 7/2006 | Lee | |
| 2007/0063293 A1* | 3/2007 | Terashima | 257/400 |
| 2007/0075363 A1* | 4/2007 | Otake et al. | 257/335 |

FOREIGN PATENT DOCUMENTS

| | | |
|---|---|---|
| CN | 1085690 | 4/1994 |
| CN | 1215926 | 5/1999 |
| JP | 4-130764 | 5/1992 |
| JP | 5-136405 | 6/1993 |
| JP | 9-139438 | 5/1997 |
| JP | 2004-039774 | 2/2004 |

* cited by examiner

*Primary Examiner* — Matthew E Warren
*Assistant Examiner* — David Chen
(74) *Attorney, Agent, or Firm* — Morrison & Foerster LLP

(57) ABSTRACT

It is desirable to reduce chip area, lower on resistance and improve electric current driving capacity of a DMOS transistor in a semiconductor device with a DMOS transistor. On the surface of an N type epitaxial layer, a P+W layer of the opposite conductivity type (P type) is disposed and a DMOS transistor is formed in the P+W layer. The epitaxial layer and a drain region are insulated by the P+W layer. Therefore, it is possible to form both the DMOS transistor and other device element in a single confined region surrounded by an isolation layer. An N type FN layer is disposed on the surface region of the P+W layer beneath the gate electrode. An N+D layer, which is adjacent to the edge of the gate electrode of the drain layer side, is also formed. P type impurity layers (a P+D layer and a FP layer), which are located below the drain layer, are disposed beneath the contact region of the drain layer.

5 Claims, 8 Drawing Sheets

FIG. 7

| | Vt (V) | Ron (Ω) | Gm (S/μm) | Idsat (A/μm) | BVds (V) | BVdson (V) (Vg=10V) |
|---|---|---|---|---|---|---|
| DMOS1(FN=5.5×10$^{12}$) | 2.00 | 11185.70 | 3.62×10$^{-4}$ | 24.0×10$^{-5}$ | 30.30 | ≧30 |
| DMOS2(FN=6.0×10$^{12}$) | 1.760 | 10395.00 | 3.89×10$^{-4}$ | 25.7×10$^{-5}$ | 30.80 | ≧30 |
| Normal DMOS | 1.90 | 23754.00 | 5.51×10$^{-5}$ | | 30.80 | |

SEMICONDUCTOR DEVICE WITH DIFFUSED MOS TRANSISTOR AND MANUFACTURING METHOD OF THE SAME

BACKGROUND OF THE INVENTION

1. Field of the Invention

This invention relates to a semiconductor device, especially to a DMOS (diffused MOS) type transistor.

2. Description of the Related Art

A DMOS type high withstand voltage MOS transistor has a high source-drain breakdown voltage or a high gate breakdown voltage. It has been broadly used in driver such as LCD driver as well as in power source circuit. Especially, a MOS transistor with a high source-drain breakdown voltage (BVds) and a low on resistance has been sought after in recent years.

FIG. 8 is a cross-sectional view of a configuration with both an N channel type DMOS transistor 100 and a P channel type MOS transistor 101 on a same semiconductor substrate.

An N type epitaxial layer 103 is disposed on the surface of a P type semiconductor substrate 102. An N+ type buried layer 104 is formed at the interface between the epitaxial layer 103 and the semiconductor substrate 102. The epitaxial layer 103 is divided into a plurality of regions by an isolation layer 105 made of P type impurities. In this figure, the device has a first confined region 106 and a second confined region 107.

An upper isolation layer 105a and a lower isolation layer 105b are superimposed in the epitaxial layer 103, making one portion, the isolation layer 105. The upper isolation layer 105a is formed by diffusing P type impurities, such as boron, downward from above the epitaxial layer 103. The lower isolation layer 105b is formed by diffusing P type impurities, such as boron, upward from the bottom surface of the semiconductor substrate 102.

The DMOS transistor 100 is formed in the epitaxial layer 103 of the first confined region 106. A gate electrode 109 is disposed on the epitaxial layer 103 with a gate insulation layer 108 between them. A P type body layer 110 is formed on the surface of the epitaxial layer 103 and an N+ type source layer 111 is formed adjacent to one edge of the gate electrode 109 on the surface of the body layer 110. Also, an N+ type drain layer 112 is formed adjacent to the other edge of the gate electrode 109 on the surface of the epitaxial layer 103.

The surface region of the body layer 110 between the epitaxial layer 103 and the source layer 111 is a channel region CH. A P+ type potential fixation layer 113 for fixing the potential of the body layer 110 is formed right next to the source layer 111.

The P channel type MOS transistor 101 that is configured from a source layer 114 on the epitaxial layer 103, a drain layer 115, a gate electrode 117 formed on the epitaxial layer 103 with a gate insulation film 16 between them, is formed in the second confined region 107.

The technology related to this invention is published in Japanese Patent Application Publication No. 2004-039774.

The epitaxial layer 103 also functions as a drain region in the DMOS transistor 100 described above. That is, the drain layer 112 and the epitaxial layer 103 are set at the same potential. Therefore, there is a limitation to what element can be formed with the DMOS transistor 100 within single region confined by the isolation layer 105 described above. For example, it is not possible to form both the DMOS transistor 100 and a P channel type MOS transistor 101 within single confined region. It is not possible either to form the DMOS transistor 100 and the DMOS transistor of an opposite conductivity type (P channel type) in single confined region.

However, the intense miniaturization and the higher integration of semiconductor device has been sought after in recent years. For example, there are cases, where voltages used in one confined area differ from that of different confined region: 200 volts as a high power source voltage (Vdd1) and 190 volts as a low power source voltage (Vss1) are used in one confined region and 10 volts as a high power source voltage and 0 volt as a low power source voltage are used in another confined region. With the configuration of prior arts, a large number of confined regions need to be formed in these cases, leading to the enlarged chip area.

SUMMARY OF THE INVENTION

This invention is directed to the reduction of chip area in a semiconductor device with a DMOS transistor.

Also, a DMOS transistor that has a low on resistance (a resistance between a source and a drain) and a high electric current driving capacity is desirable. Therefore, this invention is also directed to offer a DMOS transistor that has a high source-drain breakdown voltage, a low on resistance, and a high electric current driving capacity.

The characteristics of this invention are as follows; the semiconductor device of this invention has a well layer of a second conductivity type which separates devices formed on the surface of a semiconductor layer of a first conductivity type, and a DMOS transistor formed in the well layer. The DMOS transistor has a body layer of the second conductivity type that includes a channel region formed on the surface of the well layer, a source layer of the first conductivity type formed on the surface of the body layer, a gate electrode disposed on a part of the body layer with a gate insulation film between them, a drain layer of the first conductivity type formed on the surface of the well layer, and a first diffusion layer of the first conductivity type for reducing on resistance formed beneath the gate electrode. The second conductivity type means the conductivity type opposite to the first conductivity type.

The characteristics of the method manufacturing the semiconductor device of this invention include a process of forming a well layer of a second conductivity type which separates elements formed on the surface of the semiconductor layer of a first conductivity type, a process of forming a first diffusion layer of the first conductivity type for lowering on resistance in the gate electrode region, a process of forming a gate electrode on a part of the first diffusion layer with a gate insulation film between them, a process of forming a body layer of the second conductivity type in the well layer beneath a part of the region of the gate electrode, a process of forming a source layer in the body layer adjacent to the gate electrode, and a process of forming a drain layer in the well layer.

BRIEF DESCRIPTION OF THE DRAWINGS

FIG. 7 is a table explaining the characteristics of the semiconductor device of this invention.

DETAILED DESCRIPTION OF THE INVENTION

Figure 1:
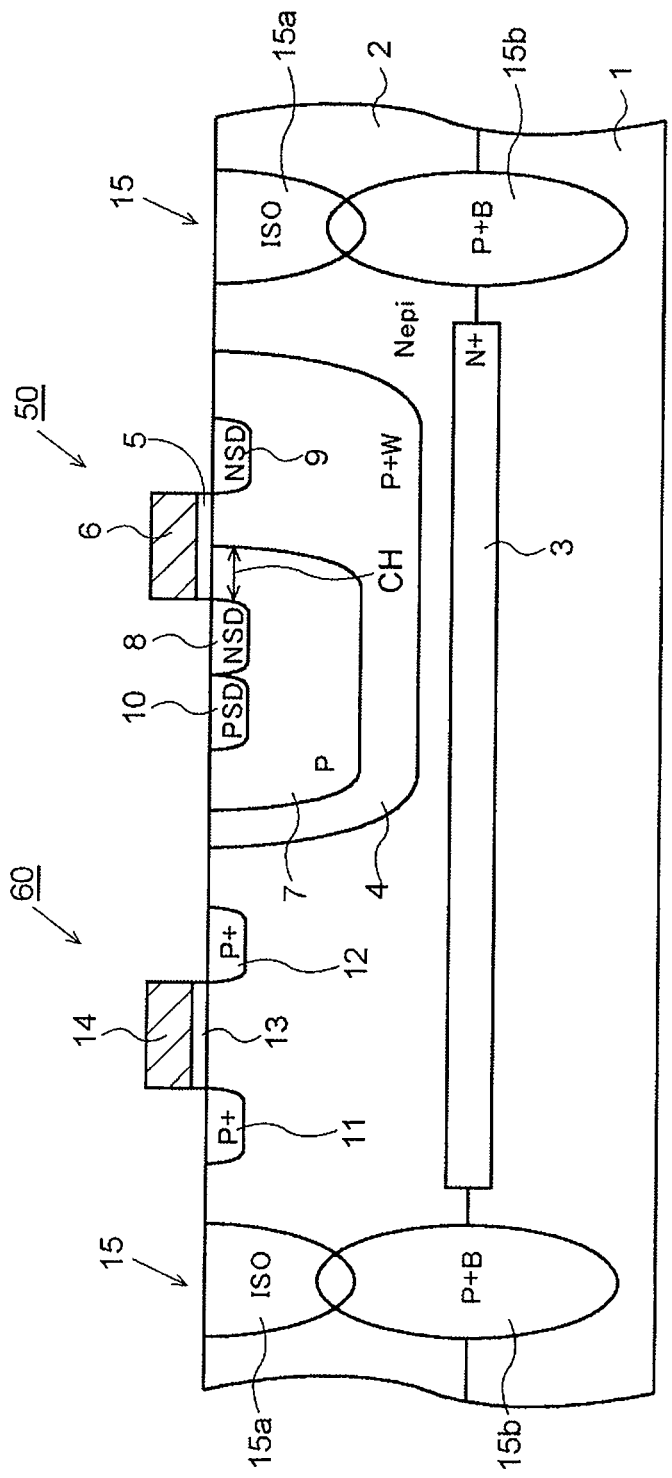
FIG. 1 is a simplified cross-sectional view of the semiconductor device of an embodiment of this invention.

Next, an embodiment of this invention will be explained by referring to figures. FIG. 1 is a simplified cross-sectional view of the semiconductor device of an embodiment of this invention.

An N type epitaxial layer 2 is disposed on the surface of a P type semiconductor substrate 1. An N+ type buried layer 3 is formed on the interface of the epitaxial layer 2 and the bottom surface of the semiconductor substrate 1. A P+W layer 4 with p-type impurities doped in it is disposed on the surface of the epitaxial layer 2. A DMOS transistor 50 is also formed in the region where the P+W layer 4 has been disposed.

The explanation on the DMOS 50 transistor will be made. A gate electrode 6 is disposed on the P+W layer 4 with a gate insulation film 5 between them. A body layer 7 with p-type impurities doped in it is formed on the P+W layer 4 and an N type source layer 8 (NSD) adjacent to one edge of the gate electrode 6 is disposed on the surface of the body layer 7. An N type drain layer 9 is also formed at the other edge of the gate electrode 6 on the surface of the P+W layer 4. The drain layer 9 can be formed away from the gate electrode 6.

It is noted that conductivity types such as P+, P and P− belong in a general conductivity type, and conductivity types such as N+, N and N− belong in another general conductivity type.

The surface of the body layer 7 between the P+W layer 4 and the source layer 8 is a channel region CH. A P+ type voltage fixation layer 10 (PSD) for fixing the voltage of the body layer 7 is formed within the body layer 7 adjacent to the source layer 8.

A P channel type MOS transistor 60 is also formed in the same epitaxial layer 2. The MOS transistor 60 is configured from a source layer 11 (P+), a drain layer 12 (P+) and a gate electrode 14 formed on the epitaxial layer 2 with a gate insulation film 13 between them.

An isolation layer 15 formed by diffusing p-type impurities is disposed to surround both the DMOS transistor 50 and the MOS transistor 60. The isolation layer 15 is configured from an upper isolation layer 15a and a lower isolation layer 15b that are superimposed in the epitaxial layer 2 to configure a single layer. The upper isolation layer 15a is formed by diffusing p-type impurities, such as boron, downward from the upper surface of the epitaxial layer 2. On the other hand, the lower isolation film 15b is formed by diffusing p-type impurities, such as boron, upward from the lower surface of the semiconductor substrate 1. The neighboring regions are isolated from each other by the presence of the isolation layer 15.

The P+W layer 4 is formed in the N type epitaxial layer 2, and the N channel type DMOS transistor 50 is formed in the P+W layer 4 in the configuration described above. Since the epitaxial layer 2 and the drain region of the DMOS transistor 50 are insulated by the P+W layer 4 in this configuration, it is possible to set voltage different from each other. Therefore, other device element can be efficiently disposed with the DMOS transistor within a single region surrounded by the isolation layer 15, leading to the reduction of the chip area compared to the device of prior arts. Additionally, the other device element (the MOS transistor in the configuration described above) is not affected by this configuration.

Figure 2:
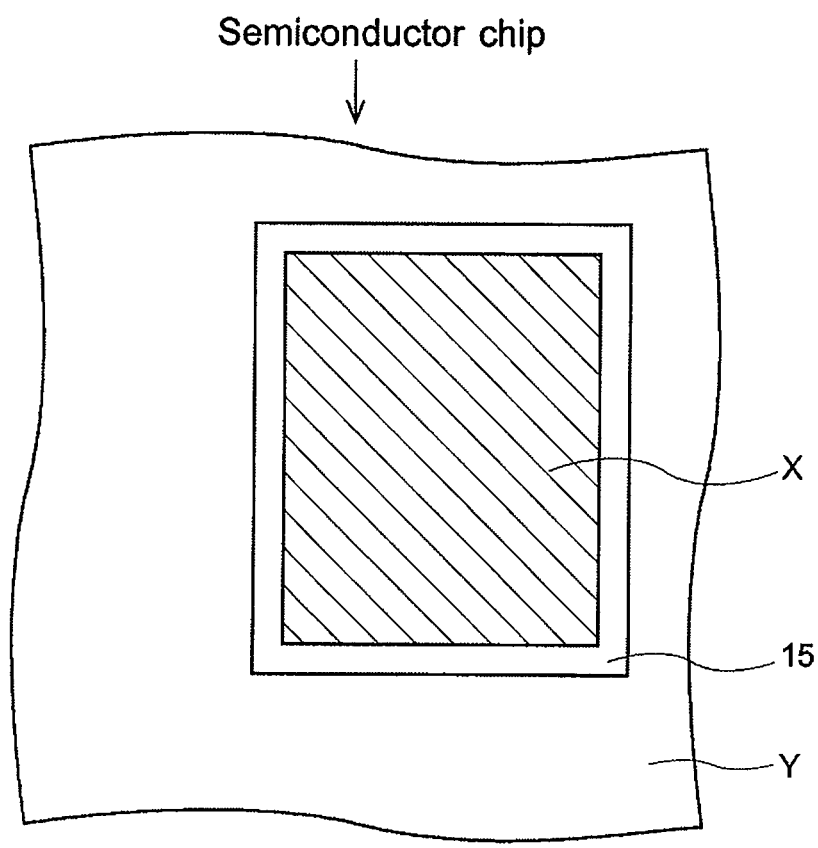
FIG. 2 is a simplified cross-sectional view of the semiconductor device of an embodiment of this invention.

The design of the semiconductor chip shown in FIG. 2 is possible with this configuration. The DMOS transistor that uses, for example, 200 volts as a high power source voltage (Vdd1) and 190 volts as low power source voltage (Vss1) and the device element that uses the same power source voltages (Vdd1 and Vss1) as that of the DMOS transistor, such as MOS transistor and bipolar transistor are formed in a single confined area X surrounded by the isolation layer 15.

Also, the DMOS transistor that uses, for example, 10 volts as a high power source voltage (Vdd2) and 0 volt as low power source voltage (Vss2) and the device element that uses the same power source voltages (Vdd2 and Vss2) as that of the DMOS transistor, such as MOS transistor and bipolar transistor are formed in another single confined area Y surrounded by the isolation layer 15.

The confined area is determined according to the power source voltage used within the area in the embodiment of this invention. Since it is not necessary to form a plurality of the confined areas according to this embodiment, it is possible to reduce the chip area as a whole.

Next, the configuration, in which the DMOS transistor is formed in the P+W layer 4, with a lower on resistance and an improved current driving capacity will be explained by referring to figures. FIGS. 3-6 are the cross-sectional views showing the manufacturing processes of the region where the DMOS transistor is formed. The same numerical is given to the same configuration as that of the DMOS transistor 50 described above and the explanation will be omitted.

Figure 3:
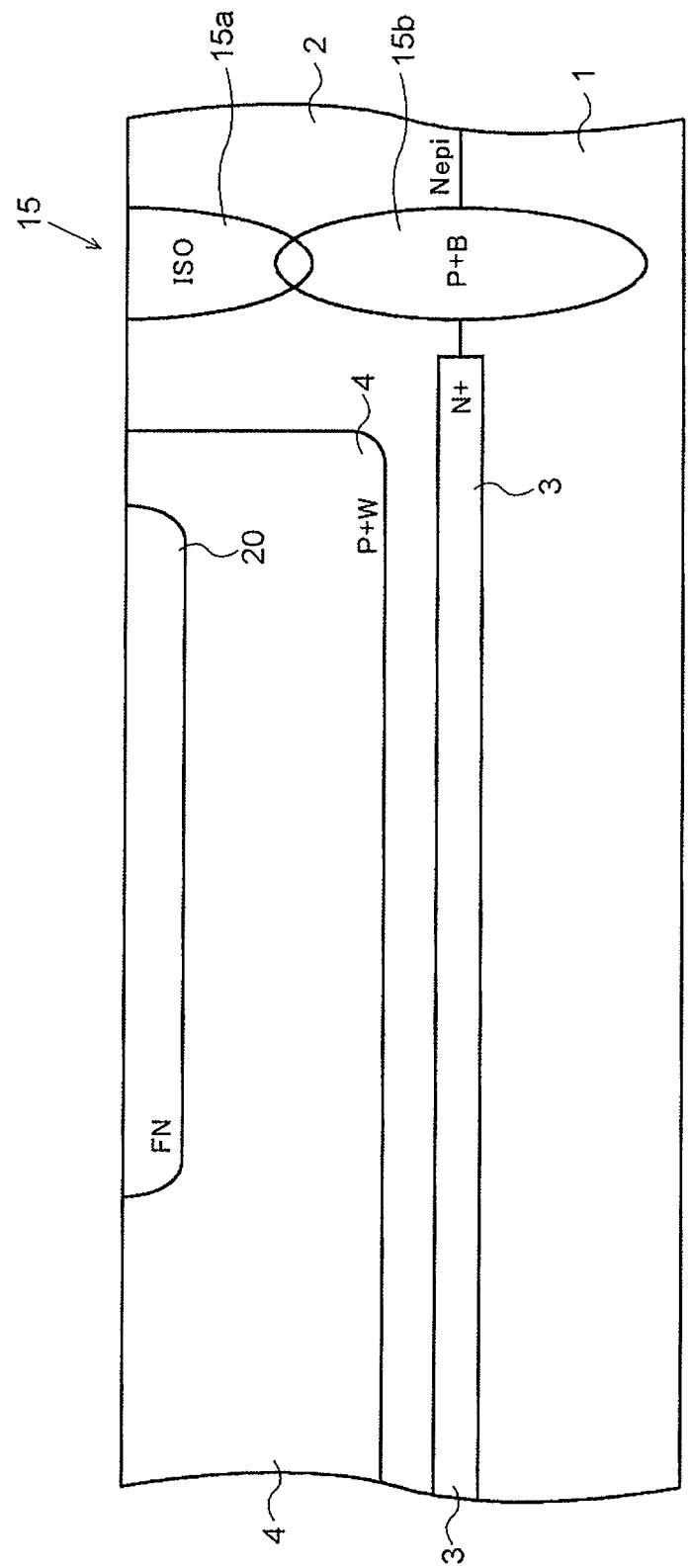
FIG. 3 is a cross-sectional view explaining the manufacturing method of the semiconductor device of an embodiment of this invention.

The epitaxial layer 2 and the N+ type buried layer 3 is formed by densely doping the ion of N type impurities to the surface of the P type semiconductor substrate 1 and allowing the epitaxial growth, as shown in FIG. 3.

Then, the lower isolation layer 15b (P+B), a part of the isolation layer 15 is formed by doping and diffusing P-type impurities to the area where the isolation layer is going to be formed on the surface of the epitaxial layer 2, using a photo resist layer that is not shown in the figure as a mask. The ion doping is performed by doping, for example, boron ion with the acceleration voltage of 80 KeV and the doping amount of $1.6 \times 10^{14}/cm^2$.

Next, the P+W layer 4 is formed by doping and diffusing P type impurities to the area where the DMOS transistor is going to be formed on the surface of the epitaxial layer 2, using a photo resist layer that is not shown in the figure as a mask. The ion doping is performed by doping, for example, boron ion with the acceleration voltage of 80 KeV and the doping amount of $3 \times 10^{13}/cm^2$.

Then, the upper isolation layer 15a (ISO) is formed by performing ion doping of P type impurities and thermal diffusion to the area corresponding to the lower isolation layer 15b, using the photo resist layer that is not shown in the figure as a mask. This process makes the upper isolation layer 15a superimpose with the lower isolation layer 15b in the epitaxial layer 2, forming a single isolation layer 15.

Then, a FN layer 20 for lowering on resistance is formed by doping N type impurities to the area including a part of the area where the gate electrode is formed on the surface of the P+W layer 4, using the photo resist layer that is not shown in the figure as a mask. The ion doping is performed by doping, for example, arsenic ion with the acceleration voltage of 160 KeV and the doping amount of $5 \times 10^{12}/cm^2$. Arsenic is used for disposing the FN layer 20 in the shallow part of the P+W layer 4, making the depletion layer expansion easier and the strength against high voltage improved. Also, it is preferable to form the FN layer 20 in the shallow part in order to prevent punch through.

Figure 4:
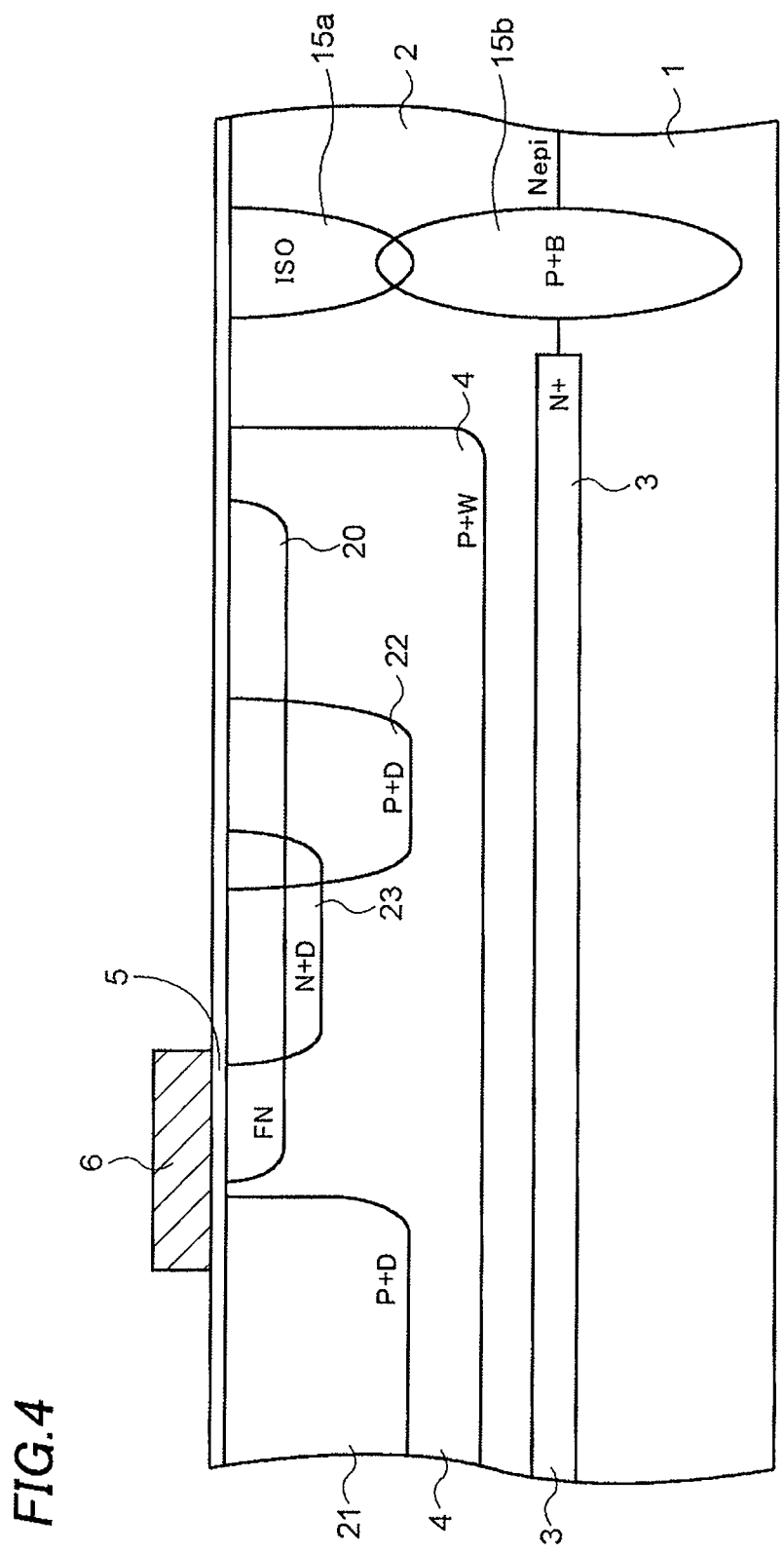
FIG. 4 is a cross-sectional view explaining the manufacturing method of the semiconductor device of an embodiment of this invention.

The gate insulation film 5 with the film thickness of 90 nm is disposed by, for example, performing thermal oxidation method on the surface of the semiconductor substrate 1, as shown in FIG. 4. Then, the gate electrode 6 with the film thickness of 400 nm is formed on the gate insulation film 5. The gate electrode 6 is patterned to take the position above a part of a FN layer 20. The gate electrode 6 is made of materials such as poly-silicon or high melting point metal silicide.

A P+D layer 21, which becomes a part of the body layer, is formed by doping P type impurities and performing thermal diffusion to the surface of the P+W layer 4 on the left side of the gate electrode 6, using the gate electrode 6 as a part of mask. At the same time, a P+D layer 22, which is separated from the gate electrode 6, is formed on the surface of the P+W layer 4 on the right side of the gate electrode 6. The ion doping is performed by using, for example, boron ion, with the accelerate voltage of 50 KeV and the doping amount of $2 \times 10^{13}/cm^2$. The P+D layer 22 is formed beneath the area where a contact is going to be disposed later. The P+D layer 22 makes the breakdown point deeper compared to the case where there is no P+D layer 22, contributing to the improvement of the resistance against the static charge breakdown.

An N+D layer 23, which has the concentration of N type impurities higher than that of the FN layer 20 and which has N type impurities doped deeper than the FN layer 20, is disposed by doping N type impurities to the surface of the P+W layer 4 on the right side of the gate electrode 6, using the gate electrode 6 as a part of mask. The ion doping is performed by using, for example, phosphorus ion, with the accelerate voltage of 100 KeV and the doping amount of $1.5 \times 1013/cm^2$. The concentration of N type impurities gradually increases from the edge of the FN layer 20 of the gate electrode 6 side toward the drain region side, reducing on resistance. Since the N+D layer 23 is formed reaching below the FN layer 20, there is a difference in the distribution of N type impurities. This makes the expansion of the depletion layer beneath the gate electrode 6 easy, leading to the shorter effective channel length.

Figure 5:
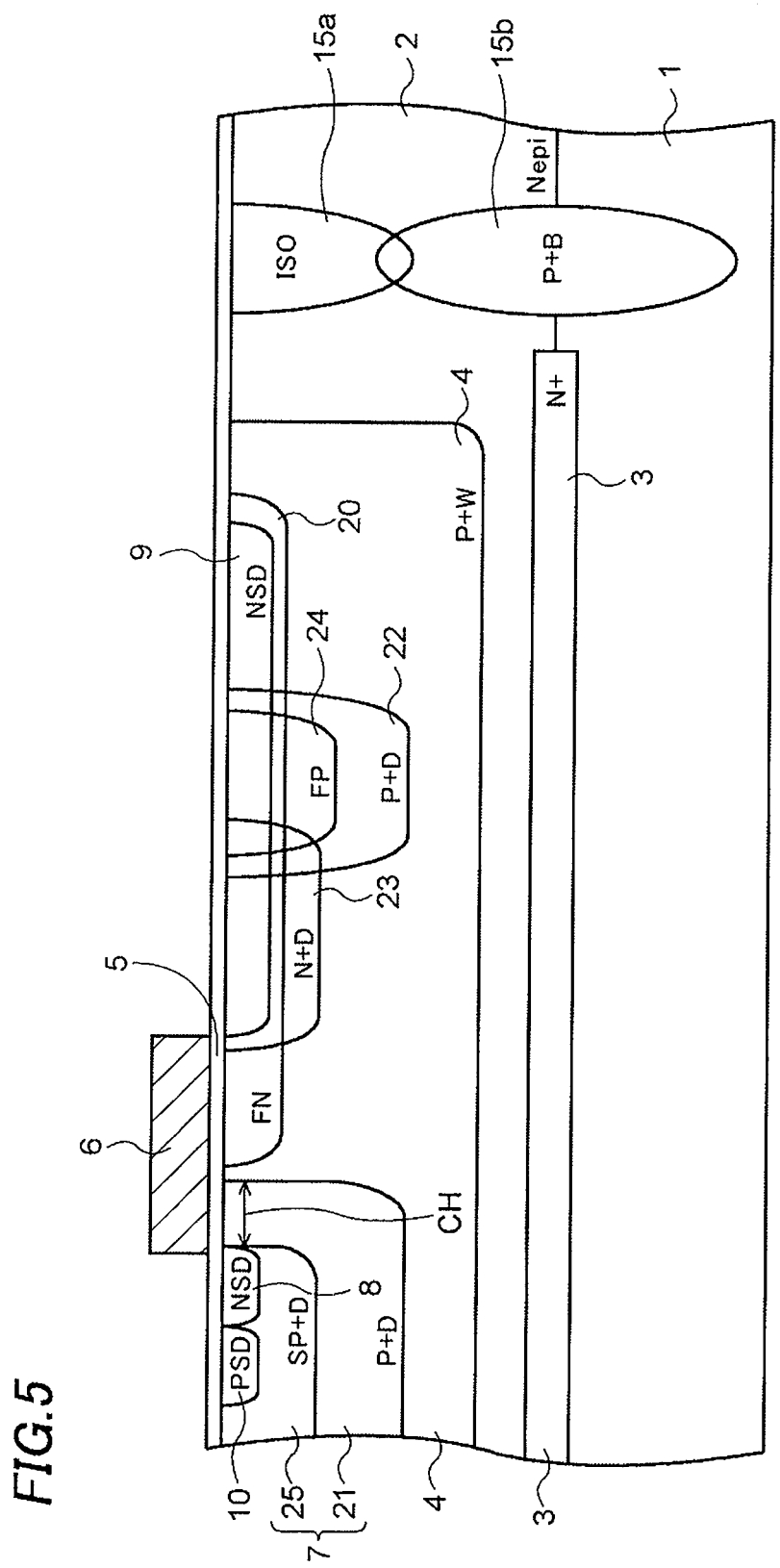
FIG. 5 is a cross-sectional view explaining the manufacturing method of the semiconductor device of an embodiment of this invention.

A FP layer 24, which is superimposed with the P+D layer 22, is formed by doping P type impurities to the region where the P+D layer 22 has been disposed, using the photo resist layer not shown in the figure as a mask, as shown in FIG. 5. The ion doping is performed by using, for example, boron ion, with the accelerate voltage of 50 KeV and the doping amount of $1.5 \times 10^{13}/cm^2$. The FP layer 24, like the P+D layer 22, is formed beneath the area where a contact is going to be disposed later. The FP layer 24 makes the breakdown point deeper, contributing to the improvement of the resistance against the static charge breakdown.

Then, a SP+D layer 25, which has the concentration of P type impurities higher than that of the P+D layer 21, is formed by doping P type impurities to the surface of the P+D layer 21, using the a part of gate electrode 6 as a mask. The ion doping is performed by doping, for example, boron ion with the acceleration voltage of 50 KeV and the doping amount of $2 \times 10^{14}/cm^2$. The body layer 7 of this embodiment has the double-layered configuration; the P type P+D layer 21 and the SP+D layer 25 that has the concentration higher than that of the P+D layer 22 and that is diffused in shallower area, as explained above. Within this double-layered configuration, the P+D layer 21 with lower concentration has the strength against high voltage and the SP+D layer 25 with higher concentration adjusts the threshold value and prevents punch through.

Next, a voltage fixation layer 10 adjacent to the source layer 8 is disposed on the surface of the SP+D layer 25 by doping P type impurities, using the photo resist layer not shown in the figure as a mask. The ion doping is performed by doping, for example, phosphorus ion with the acceleration voltage of 50 KeV and the doping amount of $1.3 \times 10^{15}/cm^2$.

The source layer 8 (NSD) and the drain layer 9 (NSD) are formed at the each edge of the gate electrode 6, by doping N type impurities and performing thermal processing, using gate electrode as a part of a mask.

Figure 6:
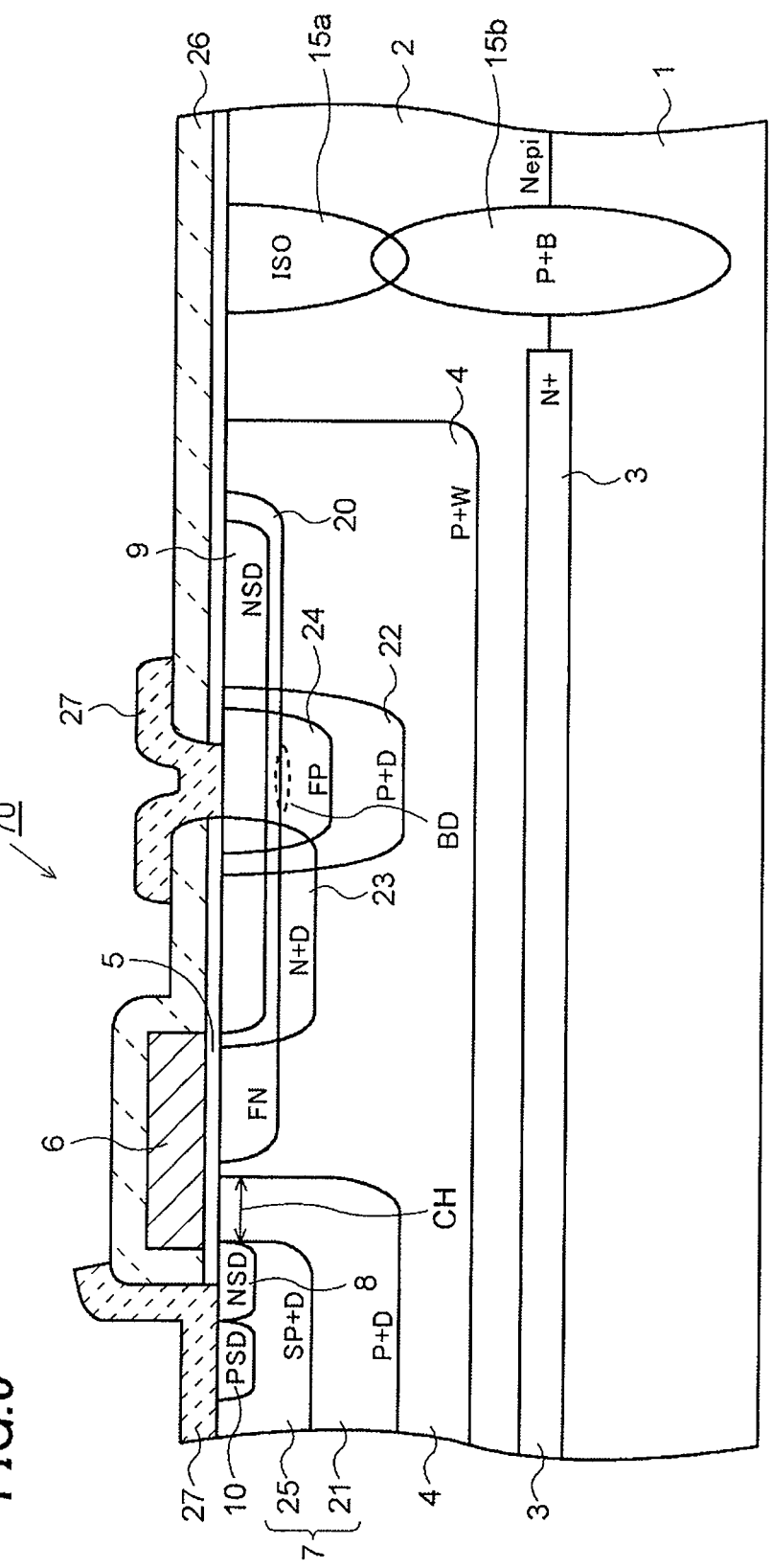
FIG. 6 is a cross-sectional view of semiconductor device of an embodiment of this invention and its manufacturing method.

Next, an interlayer insulation film 26 (for example, a silicon oxidation film or a BPSG film formed through thermal oxidation method or CVD method) is disposed on the entire surface of the semiconductor substrate 1, as shown in FIG. 6. Then, a contact hole reaching the source layer 8, the drain layer 9 and the voltage fixation layer 10 is formed by etching the interlayer insulation film 26 and the gate insulation film 5, using the photo resist layer not shown in the figure as a mask. A wiring layer 27, made of conductor material such as aluminum is formed in the contact hole. The P+D layer 22 and the FP layer 24, which have been disposed in the early processes, locate beneath the contact region.

The DMOS transistor 70 that has the source and the drain with enough strength against high voltage, low on resistance and high electric current driving capacity is formed from the manufacturing processes described above.

Figure 8:
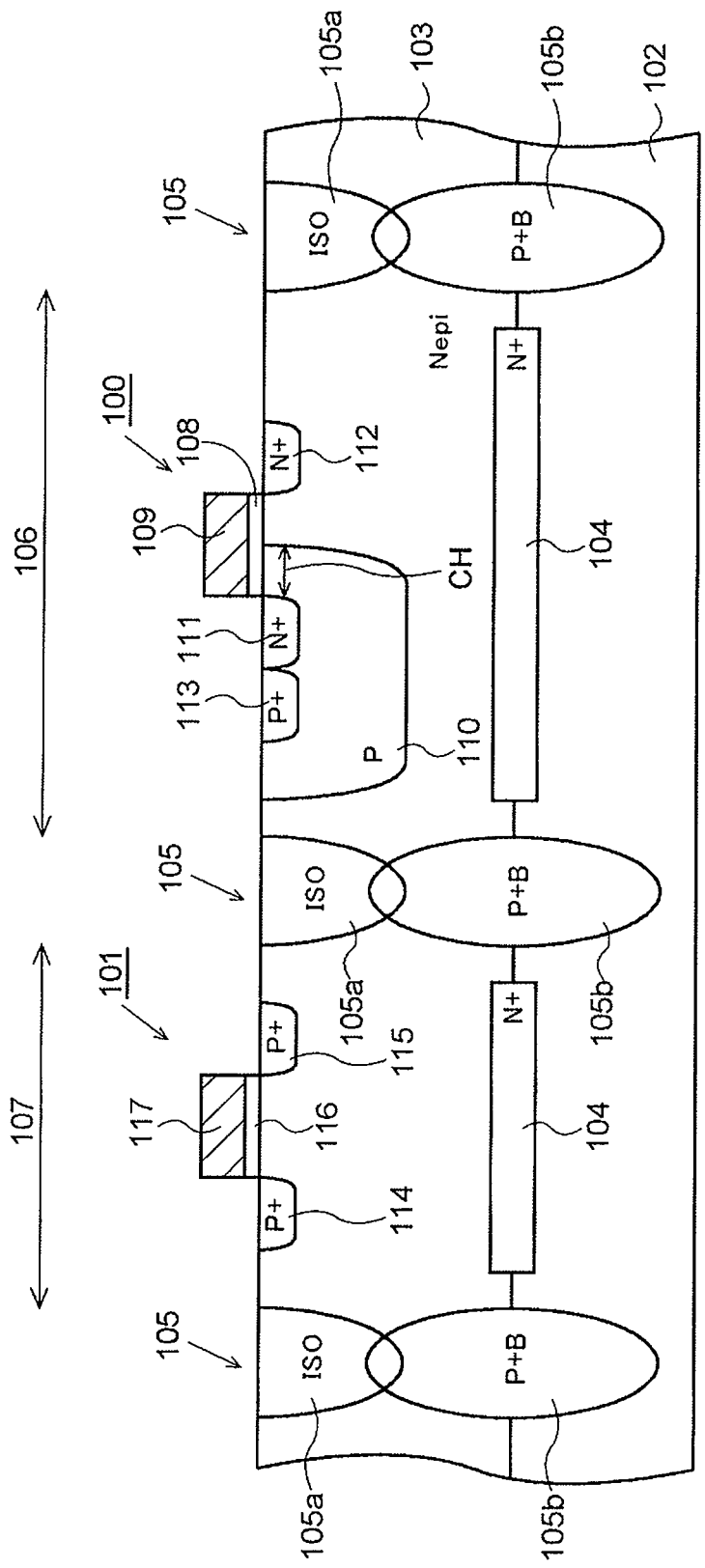
FIG. 8 is a cross-sectional view of the semiconductor device of prior arts.

An example of the operation characteristics of the DMOS transistor 70 shown in FIG. 6 will be explained. The operation characteristics among the DMOS transistor with the FN layer 20 with ion doping amount of $5.5 \times 10^{12}/cm^2$ (DMOS1), the DMOS transistor with the FN layer 20 with ion doping amount of $6.0 \times 10^{12}/cm^2$ (DMOS2), and the DMOS transistor of prior arts shown in FIG. 8 (Normal DMOS) will be compared.

FIG. 7 shows the measurements of threshold value (Vt), on resistance (Ron), transconductance (Gm), saturated electric current (Idsat), source-drain breakdown voltage when device is off (when gate voltage, drain voltage and substrate voltage is 0V), and source-drain breakdown voltage when device is on (when source voltage, substrate voltage are 0V and gate voltage Vg is 10V).

As it is shown in the figure, on resistance (Ron) of the DMOS 1 and the DMOS 2 decreased by about half compared to that of the DMOS of prior arts (Normal DMOS), while the transconductance increases by 7 times, meaning the electric current driving capacity is improved. Also, it is shown that the device maintains the same strength against high voltage (BVds) as that of the prior arts while the device is off. The withstand voltage while the device is on is also strong enough. That is, the configuration of this embodiment achieves both the maintenance of the withstand voltage and the reduction of the on resistance.

Additionally, the measurements of the different DMOS transistor are compared between the case with N+D layer 23 and the case without N+D layer 23. On resistance of the DMOS transistor with the N+D layer 23 is about 103.1 (KΩ), while the on resistance without the N+D layer 23 is about 96.3 (KΩ), decreased by about 6.6%. Therefore, it is preferable to form the N+D layer 23 for reducing the on resistance.

In the embodiment described above, the well layer which has the conductivity type opposite of that of the epitaxial layer is formed in the epitaxial layer. The DMOS transistor is located in the well layer. Therefore, it is possible to efficiently dispose the DMOS transistor and other devices element within single confined region surrounded with the isolation layer, leading to the smaller chip area compared to the configuration of prior arts.

Also, the N type impurities diffusion layers (the FN layer 20 and the N+D layer 23) are formed in such way that the concentration of the N type impurities gradually increases from the region beneath the gate electrode 6 toward the drain in the DMOS transistor of this embodiment, improving both on resistance and transconductance. Also, punch through can be prevented and strength against high voltage can be improved by forming the FN layer 20 shallower than the D layer 23.

Furthermore, the breakdown point BD is located deeper than the substrate surface by disposing the P type impurity diffusion layers (the P+D layer 22 and the FP layer 24) beneath the contact region of the drain layer 9. This makes the destruction less likely to occur at the edge of the gate and the resistance against the electrostatic discharge to improve. Here, the breakdown point is the location where break down takes place.

This invention is not limited to the embodiments described above. Needless to say, it is possible to alter the design within the scope of this invention. For example, although the embodiment described above has the double-layered configuration of the P+D layer 22 and the FP layer 24 in order to improve the resistance against the electrostatic discharge, it is also possible to improve the resistance against static electricity destruction by forming single layer with altered doping condition. Here, the explanation on the P type DMOS transistor is omitted, because only conductivity type is opposite and the configuration is the same as that of N type DMOS transistor. It is also possible that the DMOS transistor of this embodiment and a device element other than P type DMOS transistor are disposed in one device.

The well layer of second conductivity type is formed in the semiconductor layer of first conductivity type in this embodiment. The drain region of the DMOS transistor and the semiconductor substrate are insulated by the well layer. Therefore, it is possible to efficiently dispose the DMOS transistor and other devices element within a confined region surrounded with the isolation layer, leading to the smaller chip area.

What is claimed is:

1. A semiconductor device comprising: a semiconductor layer of a first general conductivity type; a well layer of a second general conductivity type formed in the semiconductor layer; a diffused metal oxide semiconductor transistor formed in the well layer, the diffused transistor comprising a body layer of the second general conductivity type formed in the well layer, a source layer of the first general conductivity type formed in the body layer, a drain layer of the first general conductivity type formed in the well layer outside the body layer, a gate electrode disposed on the well layer between the source layer and the drain layer so that a part of the body layer operates as a channel region, a first diffusion layer of the first general conductivity type formed in the well layer so as to extend from under the gate electrode toward the drain layer, a second diffusion layer of the first general conductivity type having an impurity concentration higher than the first diffusion layer and formed in the well layer so that a lateral edge of the second diffusion layer on the source layer side is located between a lateral edge of the first diffusion layer on the source layer side and a lateral edge of the drain layer on the source layer side, and an additional diffusion layer of the second general conductivity type formed in the drain layer so as to penetrate into the well layer, a lateral edge of the additional diffusion layer on the source layer side being located in the drain layer so as to be laterally separated from the gate electrode, each of the lateral edges defining a sidewall of a corresponding layer, the second diffusion layer being deeper than the first diffusion layer, and the additional diffusion layer being deeper than the second diffusion layer; another transistor formed in the semiconductor layer outside the well layer; an isolation layer formed in the semiconductor layer so as to surround the diffused transistor and the another transistor so that the diffused transistor and the another transistor are disposed in a surrounded region of the semiconductor layer that is surrounded and electrically isolated from other portions of the semiconductor layer by the isolation layer and so that the diffused transistor is not isolated from the another transistor by an isolation layer in the surrounded region; and a shallow additional diffusion layer of the second general conductivity type formed in the additional diffusion layer so as to have an impurity concentration higher than the additional diffusion layer and to be shallower than the additional diffusion layer.

2. The semiconductor device of claim 1, wherein the diffused transistor and the another transistor receive different power voltages.

3. The semiconductor device of claim 1, wherein the diffused transistor and the another transistor receive the same power voltage that is different from a power voltage that is received by the other portions of the semiconductor layer outside the surrounded region.

4. A method of manufacturing a semiconductor device comprising a diffused metal oxide semiconductor transistor, comprising: providing a semiconductor layer of a first general conductivity type; forming a well layer of a second general conductivity type in the semiconductor layer; forming a first diffusion layer of the first general conductivity type in the well layer; forming a gate electrode on the well layer so as to cover an edge portion of the first diffusion layer; forming a body layer of the second general conductivity type in the well layer so that a part of the body layer is located under the gate electrode; forming a source layer in the body layer adjacent the gate electrode; forming a drain layer in the well layer outside the body layer; forming a second diffusion layer of the first general conductivity type having an impurity concentration higher than the first diffusion layer in the well layer so that a lateral edge of the second diffusion layer on the source layer side is located between a lateral edge of the first diffusion layer on the source layer side and a lateral edge of the drain layer on the source layer side, each of the lateral edges defining a sidewall of a corresponding layer; forming an additional diffusion layer of the second general conductivity type in the drain layer so as to penetrate into the well layer, a lateral edge of the additional diffusion layer on the source layer side being located in the drain layer so as to be laterally separated from the gate electrode; forming a shallow additional diffusion layer of the second general conductivity type in the additional diffusion layer so as to have an impurity concentration higher than the additional diffusion layer and to be shallower than the additional diffusion layer; forming a transistor in the semiconductor layer outside the well layer; and forming an isolation layer in the semiconductor layer so as to surround a region of the semiconductor layer, wherein the well layer and the transistor are disposed in the surrounded region of the semiconductor layer surrounded by the isolation layer, and the diffused transistor is not isolated from the transistor by an isolation layer in the surrounded region, and the second diffusion layer is deeper than the first diffusion layer, and the additional diffusion layer is deeper than the second diffusion layer.

5. The semiconductor device of claim 1, wherein a lateral edge of the second diffusion layer on the drain layer side is located in the additional diffusion layer.

* * * * *